(12) United States Patent
Ohnuki et al.

(10) Patent No.: US 8,390,958 B2
(45) Date of Patent: Mar. 5, 2013

(54) SUSPENSION SUBSTRATE, SUSPENSION, HEAD SUSPENSION, HARD DISK DRIVE, AND METHOD FOR MANUFACTURING THE SUSPENSION

(75) Inventors: Masao Ohnuki, Shinjuku-Ku (JP); Tsuyoshi Yamazaki, Shinjuku-Ku (JP)

(73) Assignee: Dai Nippon Printing Co., Ltd., Shinjuku-ku (JP)

( * ) Notice: Subject to any disclaimer, the term of this patent is extended or adjusted under 35 U.S.C. 154(b) by 58 days.

(21) Appl. No.: 13/176,215

(22) Filed: Jul. 5, 2011

(65) Prior Publication Data
US 2012/0002366 A1    Jan. 5, 2012

(30) Foreign Application Priority Data
Jul. 5, 2010   (JP) .................................. 2010-153259

(51) Int. Cl.
*G11B 21/02* (2006.01)
(52) U.S. Cl. .................................................... 360/245.9
(58) Field of Classification Search ................. 360/245.9
See application file for complete search history.

(56) References Cited

U.S. PATENT DOCUMENTS

| 6,466,413 | B1 | 10/2002 | Takasugi |
| 6,522,503 | B2 | 2/2003 | Takadera et al. |
| 7,957,101 | B2 * | 6/2011 | Matsui et al. ............. 360/245.9 |
| 8,045,296 | B1 * | 10/2011 | Roen ........................ 360/245.8 |
| 8,138,427 | B2 * | 3/2012 | Ishii et al. ................. 174/261 |
| 8,149,542 | B2 * | 4/2012 | Ando ........................ 360/245.8 |
| 8,199,442 | B2 | 6/2012 | Okawara et al. |
| 8,208,227 | B2 * | 6/2012 | Ohsawa ..................... 360/245.9 |
| 8,218,267 | B2 * | 7/2012 | Arai et al. ................. 360/245.9 |
| 2010/0067151 | A1 | 3/2010 | Okawara et al. |
| 2010/0073825 | A1 | 3/2010 | Okawara |

FOREIGN PATENT DOCUMENTS

| JP | 11-031369 A1 | 2/1999 |
| JP | 2000-235776 A1 | 8/2000 |
| JP | 2001-297550 A1 | 10/2001 |
| JP | 2009-295195 A1 | 12/2009 |
| JP | 2010-079944 A1 | 4/2010 |
| JP | 2010-086649 A1 | 4/2010 |
| JP | 2012-014794 A1 | 1/2012 |

* cited by examiner

*Primary Examiner* — Mark Blouin
(74) *Attorney, Agent, or Firm* — Burr & Brown

(57) ABSTRACT

A suspension substrate according to the present invention includes an insulating layer, a metallic support layer provided on one face of the insulating layer, a wiring layer provided on the other face of the insulating layer, the wiring layer including a plurality of wirings and an alignment section located in a substrate main body region and isolated from each wiring. Further, in the substrate main body region, an alignment through hole is provided to extend through the metallic support layer, insulating layer and alignment section of the wiring layer. This alignment through hole is used for alignment for the actuator elements.

21 Claims, 10 Drawing Sheets

SUSPENSION SUBSTRATE, SUSPENSION, HEAD SUSPENSION, HARD DISK DRIVE, AND METHOD FOR MANUFACTURING THE SUSPENSION

CROSS REFERENCE TO RELATED APPLICATIONS

This application is based on the prior Japanese Patent Application No. 2010-153259 filed on Jul. 5, 2010, the entire contents of which are incorporated herein by reference.

FIELD OF THE INVENTION

The present invention relates to a suspension substrate, a suspension, a head suspension, a hard disk drive, and a method for manufacturing the suspension. In particular, this invention relates to the suspension substrate, suspension, head suspension, hard disk drive and method for manufacturing the suspension, respectively adapted for allowing actuator elements provided on both sides of the suspension substrate, to be accurately aligned relative to the suspension substrate.

BACKGROUND ART

Generally, the hard disk drive (HDD) includes the suspension substrate on which a magnetic head slider mounted. In this case, the magnetic head slider is provided for writing and reading data relative to a disk adapted for storing therein the data. The suspension substrate includes a metallic support layer and a wiring layer layered on the metallic support layer, via an insulating layer. The wiring layer has a plurality of (e.g., four to six) wirings. With this configuration, by flowing or sending an electric signal through each wiring, the writing and reading of the data relative to the disk can be performed.

In the hard disk drive of this type, an actuator arm for supporting the magnetic head slider and a VCM actuator (e.g., a voice coil motor) are provided respectively. In this case, in order to move the magnetic head slider to a desired data track on the disk, the actuator arm is pivoted by the VCM actuator, under control of a servo-control system.

In recent years, for an attempt to provide a more high-density disk, the width of each data track has been narrowed. However, in some cases, such an attempt makes it rather difficult to accurately align the magnetic head slider with the desired track, by using the VCM actuator.

To address this problem, the suspension of the so-called dual actuator type has been reported. In this case, the VCM actuator is cooperated with a PZT micro-actuator (or DSA (Dual Stage Actuator)), in order to accurately move the magnetic head slider to the desired track (e.g., see JP2009-295195A or JP2010-79944). Specifically, the PZT micro-actuator is composed of a piezoelectric element composed of a lead titanate zirconate (PZT) and configured to be expanded and contracted with application of a voltage, thus enabling the magnetic head slider to be finely moved. Namely, in the suspension of this dual actuator type, the VCM actuator serves to roughly control the position of the magnetic head slider, while the PZT micro-actuator serves to finely control the position of the magnetic head slider. In this way, the magnetic head slider can be aligned, rapidly and accurately, with the desired track.

SUMMARY OF THE INVENTION

As the suspension of the dual actuator type, the suspension intended for increasing displacement of the magnetic head slider, due to actuation of a pair of piezoelectric elements respectively arranged on both sides of the suspension substrate, is studied.

However, in the suspension of this type, it has been so far quite difficult to align the pair of piezoelectric elements, with high accuracy, relative to the suspension substrate. Therefore, the accuracy of the displacement of the magnetic head slider due to the piezoelectric elements may tend to be unduly degraded.

The present invention was made in light of the above problem. Therefore, it is an object of this invention to provide the suspension substrate, suspension, head suspension, hard disk drive and method for manufacturing the suspension, respectively capable of allowing the actuator elements provided on both sides of the suspension substrate, to be accurately aligned relative to the suspension substrate.

In a first aspect for achieving the above challenge, the present invention provides the suspension substrate including a substrate main body region and a pair of connection structure regions, respectively connectable with the actuator elements that are respectively arranged on both sides of the substrate main body region, wherein this suspension substrate further includes: the insulating layer; the metallic support layer provided on one face of the insulating layer; the wiring layer provided on the other face of the insulating layer, the wiring layer including the plurality of wirings and an alignment section located in the substrate main body region and isolated from each wiring; and an alignment through hole provided to extend through the metallic support layer, insulating layer and alignment section of the wiring layer, in the substrate main body region, the alignment through hole being used for the alignment for the actuator elements.

In the first aspect of this invention, the alignment through hole may be located on a central axis of a load beam for holding the metallic support layer.

Alternatively or additionally, in the first aspect of this invention, the suspension substrate may further include two jig holes, respectively provided to extend through the metallic support layer and insulating layer, the jig holes being used for the alignment when a load beam for holding the metallic support layer is mounted, wherein the alignment through hole is located on a straight line connecting the two jig holes.

Further, in the first aspect of this invention, the alignment section of the wiring layer may extend to the inward side of the alignment through hole, wherein a gold plating is provided to an exposed portion of the alignment section of the wiring layer in the alignment through hole.

Alternatively or additionally, in the first aspect of this invention, the suspension substrate may further include a protective layer for covering each wiring and the alignment section of the wiring layer, wherein the alignment through hole extends through the protective layer.

In a second aspect for achieving the above challenge, the present invention provides the suspension substrate including the substrate main body region and the pair of connection structure regions, respectively connectable with the actuator elements that are respectively arranged on both sides of the substrate main body region, wherein this suspension substrate further includes: the insulating layer; the metallic support layer provided on one face of the insulating layer; the wiring layer provided on the other face of the insulating layer, the wiring layer including the plurality of wirings and the alignment section located in the substrate main body region and isolated from each wiring; the protective layer for covering each wiring and the alignment section of the wiring layer; and the alignment through hole provided in a position corresponding to the alignment section of the wiring layer, the alignment through hole extending through the protective layer and being used for the alignment for the actuator elements.

In the second aspect of this invention, the alignment through hole may be located on the central axis of the load beam for holding the metallic support layer.

Alternatively or additionally, in the second aspect of this invention, the suspension substrate may further include the two jig holes, respectively provided to extend through the metallic support layer and insulating layer, the jig holes being used for the alignment when the load beam for holding the metallic support layer is mounted, wherein the alignment through hole is located on the straight line connecting the two jig holes.

Further, in the second aspect of this invention, the alignment through hole may extend through the alignment section of the wiring layer and the insulating layer, wherein a nickel plating is provided to the alignment through hole.

Further, in the second aspect of this invention, a gold plating may be provided to the exposed portion of the alignment section of the wiring layer in the alignment through hole.

Further, in the second aspect of this invention, the protective layer may include a protective layer separation portion formed at a central portion of the alignment through hole.

In addition, the present invention provides the suspension including: a base plate; the suspension substrate of this invention attached to the base plate via the load beam; and a pair of actuator elements respectively joined to at least one of the base plate and load beam and connected with the connection structure regions of the suspension substrate.

In this suspension of the present invention, an inspection hole for allowing at least a part of the periphery of the alignment through hole to be exposed may be formed in the base plate and load beam.

Alternatively or additionally, in the suspension of the present invention, the inspection hole may have a shape different from the alignment through hole.

Further, in the suspension of the present invention, the periphery of the alignment through hole may be all exposed in the inspection hole.

In addition, the present invention provides the head suspension including: the suspension of this invention; and a slider mounted on the suspension.

In addition, the present invention provides the hard disk drive including the head suspension of this invention.

Further, the present invention provides the method for manufacturing the suspension including the substrate main body region and the pair of connection structure regions, respectively connectable with the actuator elements that are respectively arranged on both sides of the substrate main body region, wherein this method includes: preparing the suspension substrate including the insulating layer, the metallic support layer provided on one face of the insulating layer, the wiring layer provided on the other face of the insulating layer, the wiring layer including the plurality of wirings and the alignment section located in the substrate main body region and isolated from each wiring, and the alignment through hole provided to extend through the metallic support layer, insulating layer and alignment section of the wiring layer, in the substrate main body region, the alignment through hole being used for the alignment for the actuators; attaching the suspension substrate to the base plate via the load beam; aligning the actuator elements with the suspension substrate, by using the alignment through hole of the suspension substrate; and joining such aligned actuator elements to at least one of the base plate and load beam by using an adhesive, as well as connecting the actuator elements with the connection structure regions of the suspension substrate.

Therefore, according to the present invention, the actuator elements, respectively located on both sides of the suspension substrate, can be aligned, accurately, relative to the suspension substrate, by using the alignment through hole.

DETAILED DESCRIPTION OF THE INVENTION

First Embodiment

Now, referring to FIGS. 1 through 10, the suspension substrate, suspension, head suspension and hard disk drive, respectively related to the first embodiment of the present invention, will be described.

Figure 1:
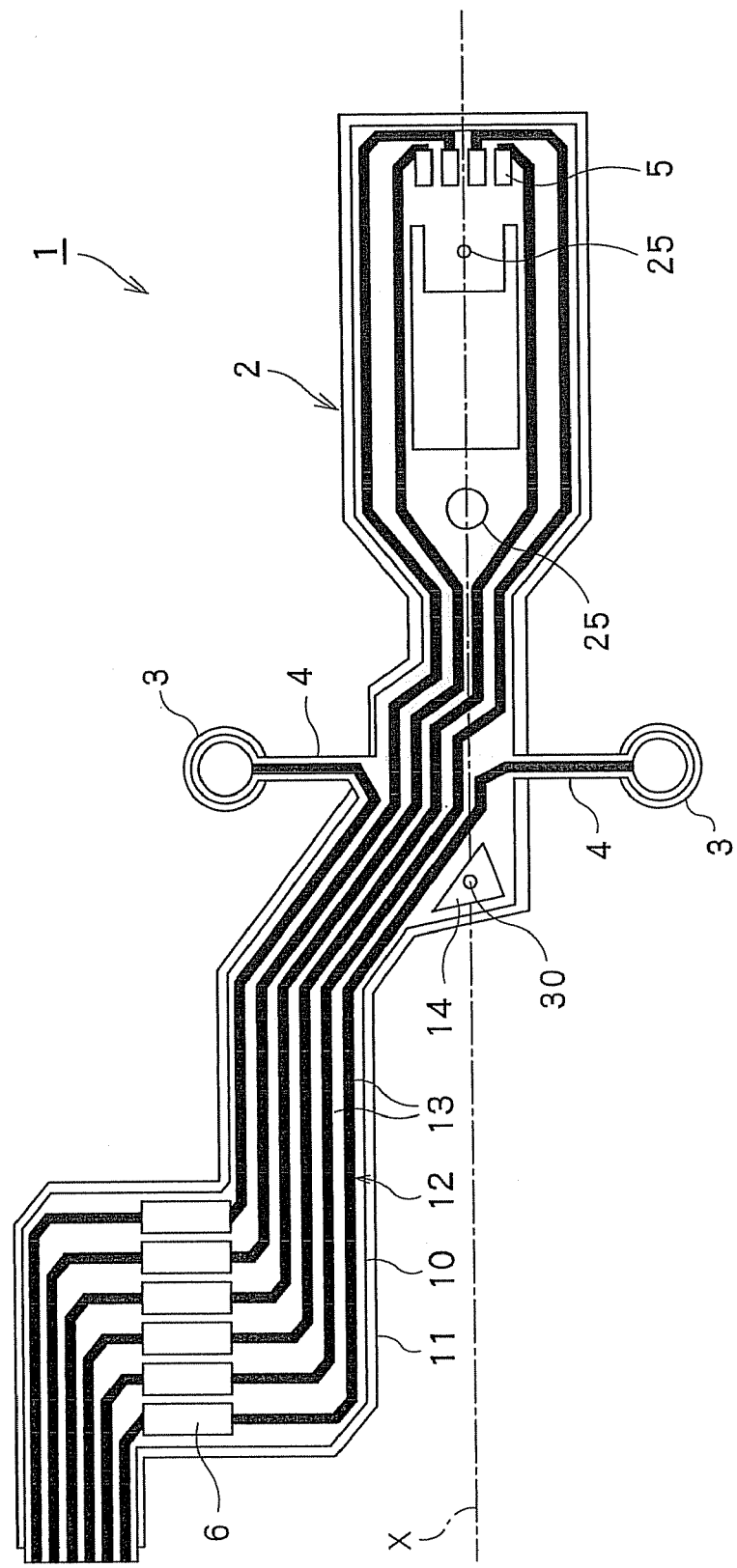
FIG. 1 is a plan view showing one example of the suspension substrate related to a first embodiment of the present invention.

As shown in FIG. 1, the suspension substrate 1 includes the substrate main body region 2, the pair of connection structure regions 3, respectively connectable with the piezoelectric elements 44 (i.e., the actuator elements, respectively shown in FIG. 3) that will be respectively located on both sides of the substrate main body region 2, and a pair of extension structure regions 4, respectively extending between the substrate main body region 2 and each connection structure region 3. It is noted that the piezoelectric elements 44 will be described later. In the substrate main body region 2, a head terminal 5 adapted to be connected with a slider 52 (see FIG. 7) that will be described later, and an external equipment connection terminal 6 adapted to be connected with external equipment (not shown) are provided, respectively. Further, the wirings 3 that will be described later are respectively provided to connect the head terminal 5 and the external equipment connection terminal 6.

Figure 2:
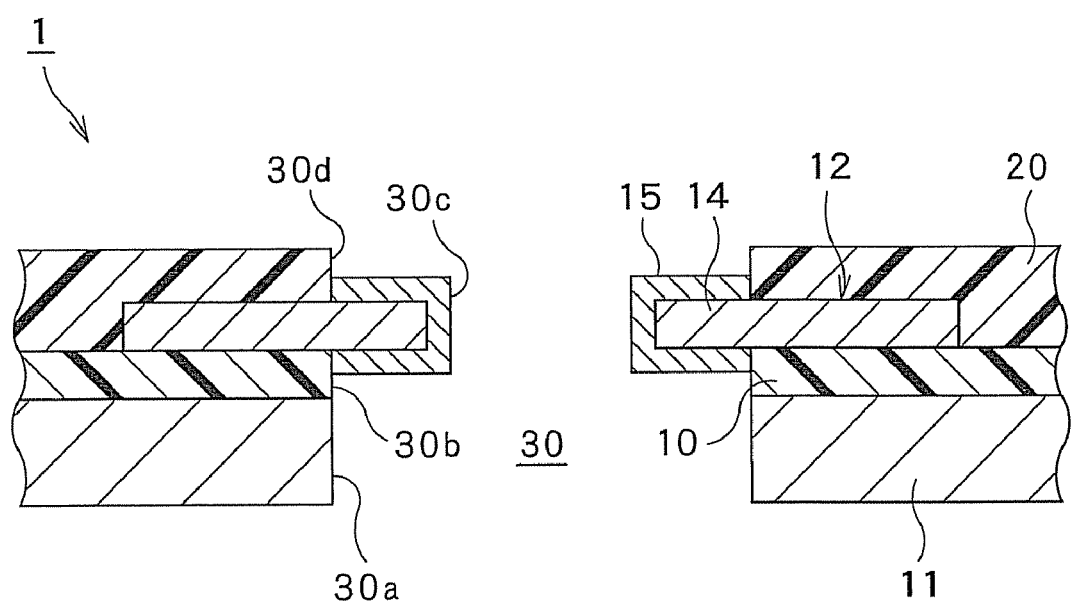
FIG. 2 is a cross section showing the alignment through hole provided in the suspension substrate related to the first embodiment of the present invention.
Figure 3:
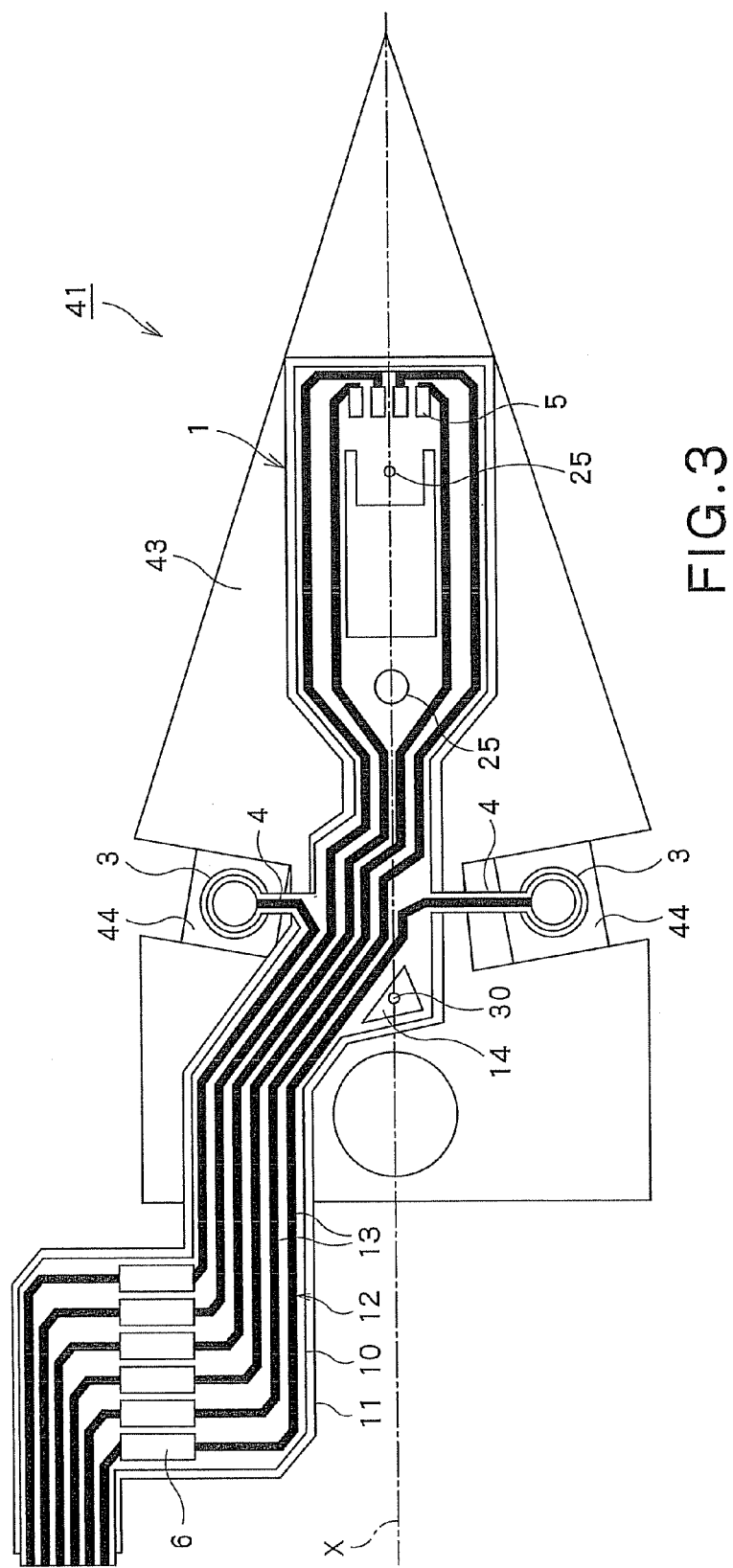
FIG. 3 is a plan view showing one example of the suspension related to the first embodiment of the present invention.

As shown in FIGS. 1 and 2, the suspension substrate 1 includes the insulating layer 10, the metallic support layer 11 provided on one face of the insulating layer 10, and the wiring layer 12 provided on the other face of the insulating layer 10. The wiring layer 12 includes the plurality of wirings 13 and the alignment section 14 isolated from each wiring 13. The alignment section 14 of the wiring layer 12 is located in the vicinity of the respective connection structure regions 3 in the substrate main body region 2, and is formed of the same material as the material used for forming each wiring 13. Two wirings of the wirings 13 respectively extend from the external equipment connection terminal 6 up to each connection structure region 3, such that the two wirings can be electrically connected with the piezoelectric elements 44, respectively.

Although not shown in the drawings, a seed layer consisting of nickel (Ni), chromium (Cr) and copper (Cu) and having an approximately 300 nm thickness is provided between the insulating layer 10 and the wiring layer 12. With the provision of this seed layer, adhesion between the insulating layer 10 and the wiring layer 12 can be enhanced.

Further, as shown in FIG. 2, the protective layer 20, for covering each wiring 13 and the alignment section 14 of the wiring layer 12, is provided on the insulating layer 10. It is noted that the protective layer 20 is not shown, for clarity, in FIG. 1.

Further, as shown in FIG. 1, the two jig holes 25 are provided to extend through the metallic support layer 11 and insulating layer 10. In this case, the two jig holes 25 are respectively used for alignment for the load beam 43 that will be described later. Further, in this case, the two jig holes 25 are respectively arranged on a central axis (X) of the load beam 43, and include a metallic-support-layer jig hole (not shown) formed in the metallic support layer 11 and an insulating-layer jig hole (not shown) formed in the insulating layer 10.

Additionally, in the vicinity of the connection structure regions 3 in the substrate main body region 2, the alignment through hole 30 is provided for alignment for the piezoelectric elements 44. As shown in FIG. 2, the alignment through hole 30 extends through the metallic support layer 11, insulating layer 10, alignment section 14 of the wring layer 12, and the protective layer 20, in the substrate main body region 2. Namely, this alignment through hole 30 is composed of a metallic-support-layer through hole 30a formed in the metallic support layer 11, an insulating-layer through hole 30b formed in the insulating layer 10, a wiring-layer through hole 30c formed in the alignment section 14 of the wiring layer 12, and a protective-layer through hole 30d formed in the protective layer 20. In this case, each of such metallic-support-layer through hole 30a, insulating-layer through hole 30b, wiring-layer through hole 30c and protective-layer through hole 30d, is formed into a circular shape.

As shown in FIG. 1, the alignment through hole 30 is located on the central axis (X) of the load beam 43, i.e., on a straight line connecting the two jig holes 25. Preferably, the alignment through hole 30 is located near the connection structure regions 3 which are respectively provided to be connected with the piezoelectric elements 44. With this configuration, the accuracy of the alignment between the suspension substrate 1 and the piezoelectric elements 44 can be substantially enhanced.

As shown in FIG. 2, the alignment section 14 extends to the inward side of the alignment through hole 30. Namely, the diameter of the wiring-layer through hole 30c is smaller than each diameter of the metallic-support-layer through hole 30a, insulating-layer through hole 30b and protective-layer through hole 30d.

A part or portion of the alignment section 14 of the wiring layer 12 exposed in the alignment though hole 30 is plated with nickel (Ni) and gold (Au), in this order, providing a plated layer 15. With the provision of this plated layer 15, corrosion in the exposed portion of the alignment section 14 of the wiring layer 12 can be effectively prevented. Preferably, the thickness of this plated layer 15 is within a range of from 0.1 μm to 4.0 μm.

Next, each component will be described in more detail.

As the material used for forming the insulating layer 10, any suitable material can be used, without limitation, provided that this material can exhibit desired insulating properties. For instance, a polyimide material (PI) is suitable. In this case, the material used for forming the insulating layer 10 may be either of a photosensitive material or non-photosensitive material. Preferably, the thickness of the insulating layer 10 is within a range of from 5 μm to 30 μm, more preferably 8 μm to 10 μm. This configuration can ensure sufficient insulating ability between the metallic support layer 11 and each wiring 13, as well as can prevent the rigidity of the entire suspension substrate 1 from being unduly lowered.

Each wiring 13 is provided as a conductive body or element adapted for transmitting the electric signal. As the material used for forming each wiring 13, any suitable material can be used, without limitation, provided that this material can exhibit desired conductivity. For instance, a copper (Cu) material is suitable. However, any other suitable material than the copper material can be used, provided that this material can exhibit the electric properties equivalent to those of pure copper. Preferably, the thickness of each wiring 13 is within a range of from 1 μm to 18 μm, more preferably 9 μm to 12 μm. This configuration can well ensure the transmission characteristics of each wiring 13 as well as adequately prevent the flexibility of the entire suspension substrate 1 from being unduly lowered. It is noted that the alignment section 14 is formed of the same material as the material of each wiring 13, and has the same thickness as the thickness of each wiring 13.

As the material used for forming the metallic support layer 11, any suitable material can be used, without limitation, provided that this material can exhibit desired conductivity, elasticity and strength. For instance, stainless steel, aluminum, beryllium copper and other suitable copper alloys can be used. Preferably, stainless steel is used. For instance, the thickness of the metallic support layer 11 is within a range of from 10 μm to 30 μm, more preferably 15 μm to 20 μm. With this configuration, adequate conductivity, rigidity and elasticity of the metallic support layer 11 can be ensured.

As the material used for the protective layer 20, a proper resin material, e.g., polyimide, can be used. It is noted that the material of this protective layer 20 may be either of the photosensitive material or non-photosensitive material.

Figure 4:
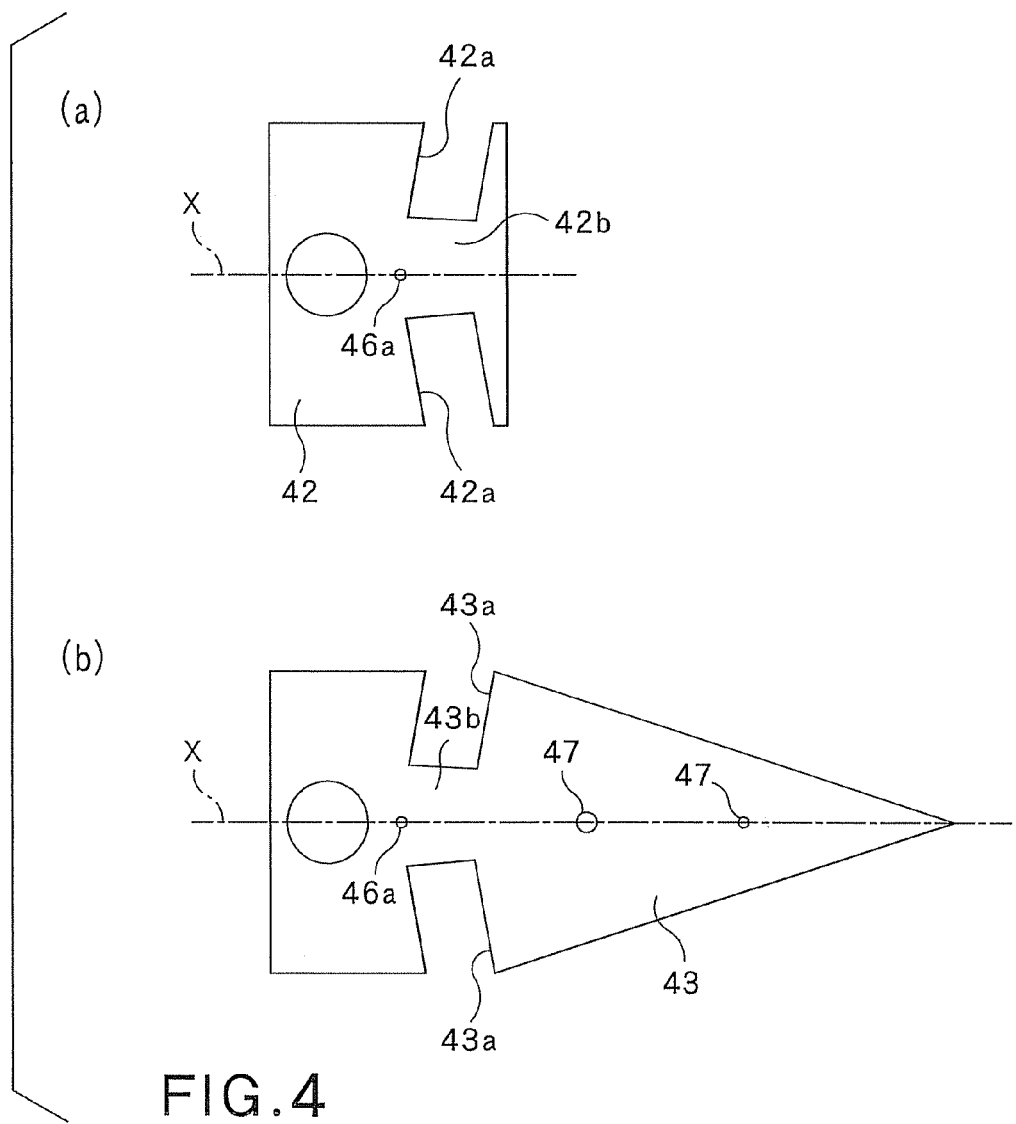
FIG. 4(*a*) is a plan view showing one example of the base plate provided in the suspension related to the first embodiment of the present invention, and FIG. 4(*b*) is a plan view showing one example of the load beam provided in the same suspension.

Now, referring to FIGS. 3 through 6, the suspension 41 related to this embodiment will be described. The suspension 41 shown in FIG. 3 includes the aforementioned suspension substrate 1, base plate 42, load beam 43 attached onto the base plate 42 and adapted for supporting the metallic support layer 11 of the suspension substrate 1, and the pair of piezoelectric elements 44 respectively joined to at least one of the base plate 42 and load beam 43 and connected with the connection structure regions 3 of the suspension substrate 1. In this embodiment, each piezoelectric element 44 is joined to both of the base plate 42 and load beam 43. The base plate 42 and load beam 43 are respectively formed of stainless steel. As shown in FIGS. 4(a), 4(b), the base plate 42 and load beam 43 respectively have a pair of recesses 42a, 43a and flexible portions 42b, 43b, respectively located between the pair of recesses 42a, 43a.

Figure 5:
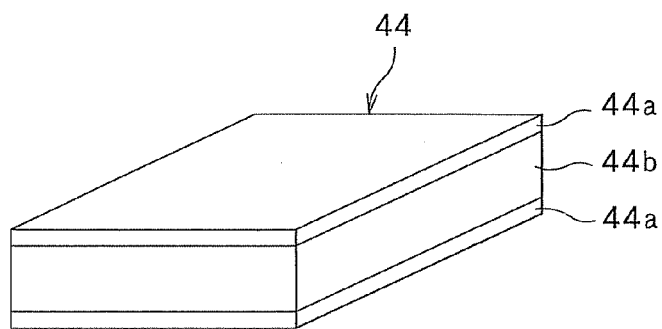
FIG. 5 is a perspective view showing one example of the piezoelectric element provided in the suspension related to the first embodiment of the present invention.

Each piezoelectric element 44 is configured to be expanded and contracted when a proper voltage is applied thereto. More specifically, as shown in FIG. 5, each piezoelectric element 44 includes a pair of electrodes 44a respectively located to be opposed relative to each other, and a piezoelectric material part 44b located between the pair of electrodes 44a and composed of a piezoelectric ceramics, such as the PZT (lead titanate zirconate) or the like. In this case, the piezoelectric material parts 44b of the pair of piezoelectric elements 44 are configured to be respectively polarized, in different directions, by 180°, relative to each other. Therefore, when a predetermined voltage is applied, one piezoelectric element 44 is contracted, while the other piezoelectric element 44 is expanded.

Such piezoelectric elements 44 are respectively stored in the pair of recesses 42a of the base plate 42 and joined to the base plate 42 and load beam 43, with a non-conductive adhesive, such that these elements 44 can be arranged to be symmetrical about the central axis (X) of the load beam 43.

Figure 6:
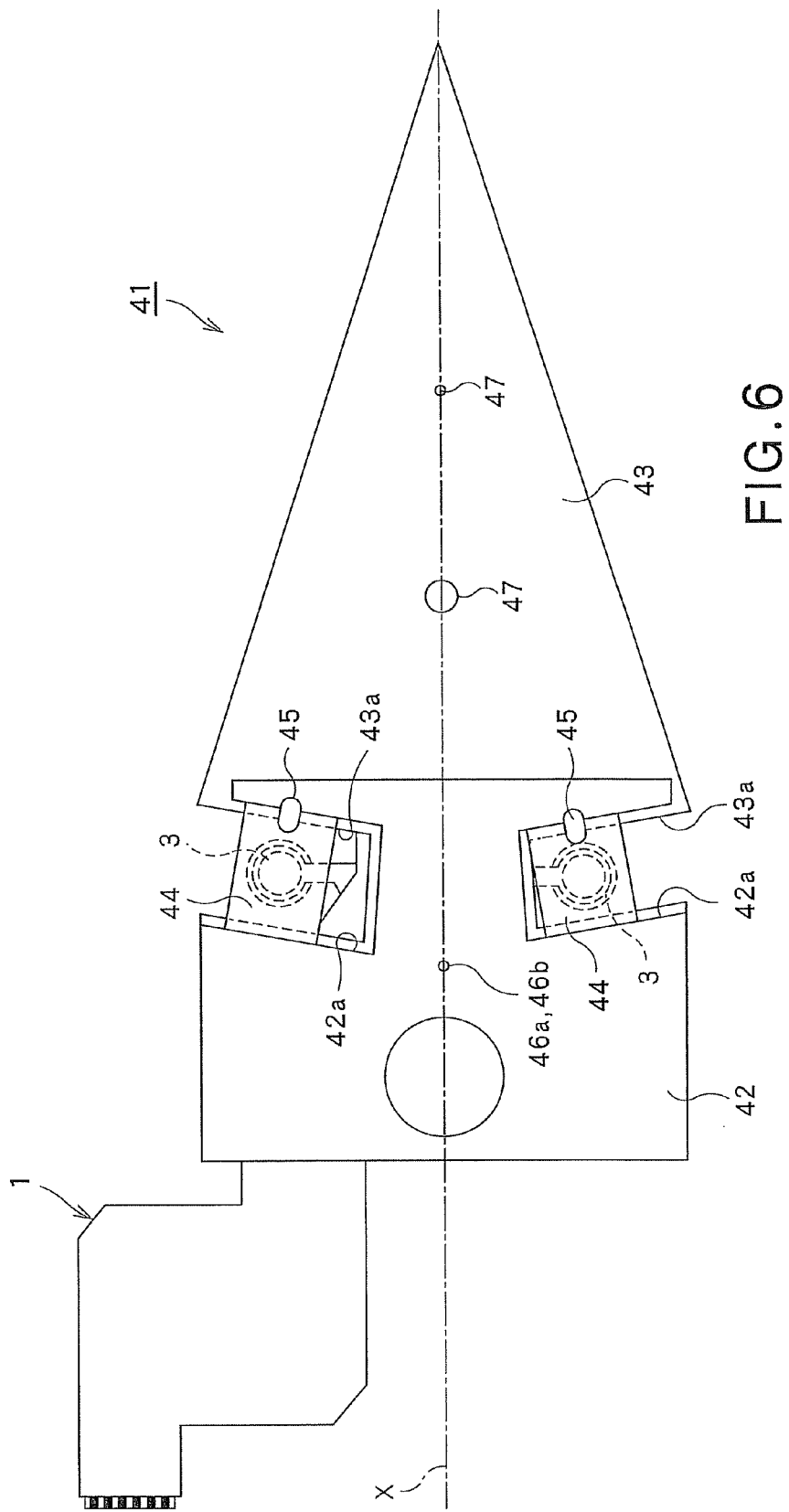
FIG. 6 is a back view showing one example of the suspension related to the first embodiment of the present invention.

In this case, as shown in FIG. 6, one electrode 44a (i.e., the electrode located on the opposite side relative to the suspension substrate 1) of each piezoelectric element 44 is electrically connected with the base plate 42, via a conductive adhesion section 45 formed of a conductive adhesive. Meanwhile, the other electrode 44a (i.e., the electrode located on the side of the suspension substrate 1) of each piezoelectric element 44 is joined and electrically connected to the connection structure region 3, via the conductive adhesive.

As shown in FIGS. 4(a), 4(b) and 6, inspection holes 46a, 46b are provided to extend through the base plate 42 and load beam 43, respectively. Such inspection holes 46a, 46b respectively serve to allow at least a part of the periphery of the alignment through hole 30 to be exposed. Namely, one inspection hole 46a is formed, as a base inspection hole, in the base plate 42, while the other inspection hole 46b is formed, as a beam inspection hole, in the load beam 43. With the provision of such inspection holes 46a, 46b, the alignment through hole 30 can be read and confirmed from the side of the protective layer 20 as well as from the side of the base plate 42.

Each inspection hole 46a, 46b may have a shape different from the shape of the alignment through hole 30. For instance, in the case in which the alignment through hole 30 has the circular shape as described above, each inspection hole 46a, 46b may have a triangular, quadrangular, octagonal, trapezoidal, rhombic or the like shape. Such a shape can positively prevent the alignment through hole 30 from being mistaken for each inspection hole 46a, 46b, upon the alignment of the piezoelectric elements 44. Otherwise, each inspection hold 46a, 46b may have the same shape as the alignment hole 30. In this case, it is preferred that each inspection hole 46a, 46b is formed greater than the alignment through hole 30, thereby exposing all of the periphery of the alignment through hole 30. With this configuration, the alignment through hole 30 can be securely read from the side of the base plate 42.

Further, beam jig holes 47 are provided in the load beam 43, respectively corresponding to the jig holes 25 of the suspension substrate 1. Such beam jig holes 47 can be respectively used for aligning the suspension substrate 1 and load beam 43, when the load beam 43 is mounted on the metallic support layer 11 of the substrate main region 2 of the suspension substrate 1.

Figure 7:
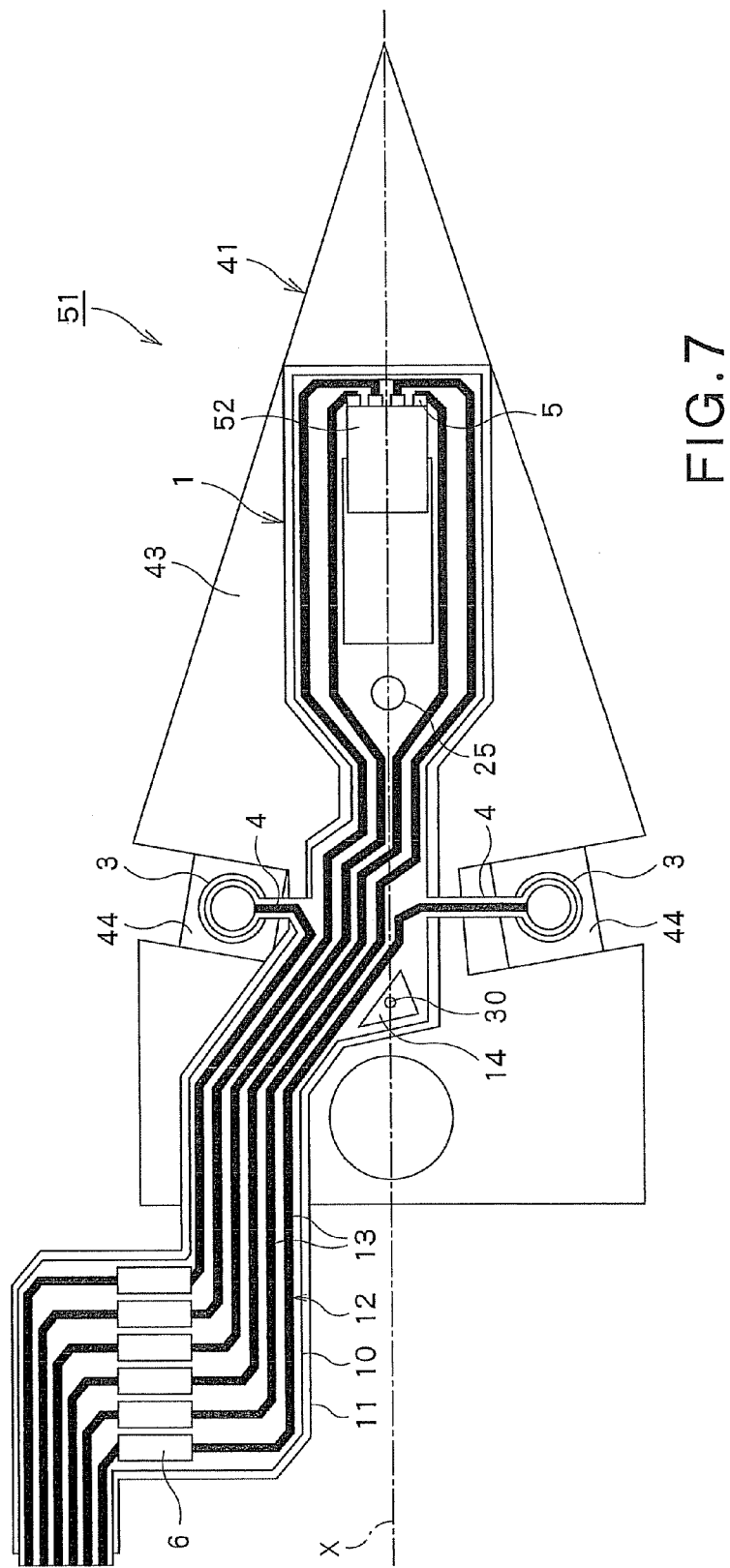
FIG. 7 is a plan view showing one example of the head suspension related to the first embodiment of the present invention.

Now, referring to FIG. 7, the head suspension 51 related to this embodiment will be described. As shown in FIG. 7, the head suspension 51 includes the aforementioned suspension 41 and slider 52 connected with the head terminal 5 of the suspension substrate 1.

Figure 8:
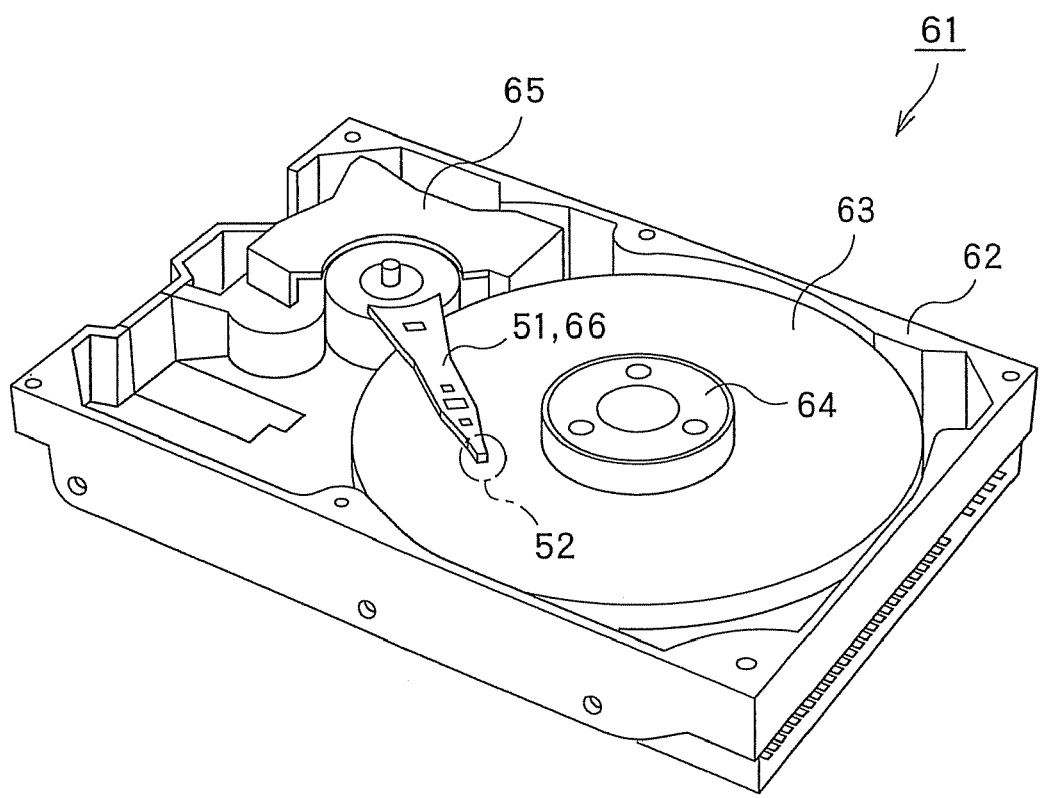
FIG. 8 is a perspective view showing one example of the hard disk drive related to the first embodiment of the present invention.

Next, referring to FIG. 8, the hard disk drive 61 related to this embodiment will be described. As shown in FIG. 8, the hard disk drive 61 includes a case 62, the disk 63 rotatably attached to the case 62 and adapted for storing therein the data, a spindle motor 64 adapted for rotating the disk 63, and the head suspension 51 including the slider 52 adapted for writing and reading the data relative to the disk 63. In this case, the head suspension 51 is provided to be moved near the disk 63, while keeping a desired flying height relative to the disk 63. Specifically, the head suspension 51 is movably attached to the case 62, such that the voice coil motor 65 attached to the case 62 can move the slider 52 of the head suspension 51 along the disk 63. Further, in this case, the head suspension 51 is attached to the voice coil motor 65, via an arm 66.

Next, one exemplary method for manufacturing the suspension substrate 1 related to the embodiment, will be discussed. In this case, one subtractive method for manufacturing the suspension substrate 1 will be described, by way of example.

First of all, a layered body or material 35 including the insulating layer 10 and metallic support layer 11 provided on one face of the insulating layer 10 and the wiring layer 12 provided on the other face of the insulating layer 10 is prepared (see FIG. 9(a)).

In this case, the metallic layer 11 is first provided, and then the insulating layer 10 is formed on the metallic support layer 11, by a coating method using non-photosensitive polyimide. Subsequently, nickel, chromium and copper are coated, by spattering, successively, on the insulating layer 10, in order to form the seed layer (not shown) thereon. Thereafter, by using the so-formed seed layer as an electrically conductive medium, the wiring layer 12 is formed by a copper plating. In this way, the layered body 35 including the insulating layer 10, metallic support layer 11 and wiring layer 12 can be obtained.

Figure 9:
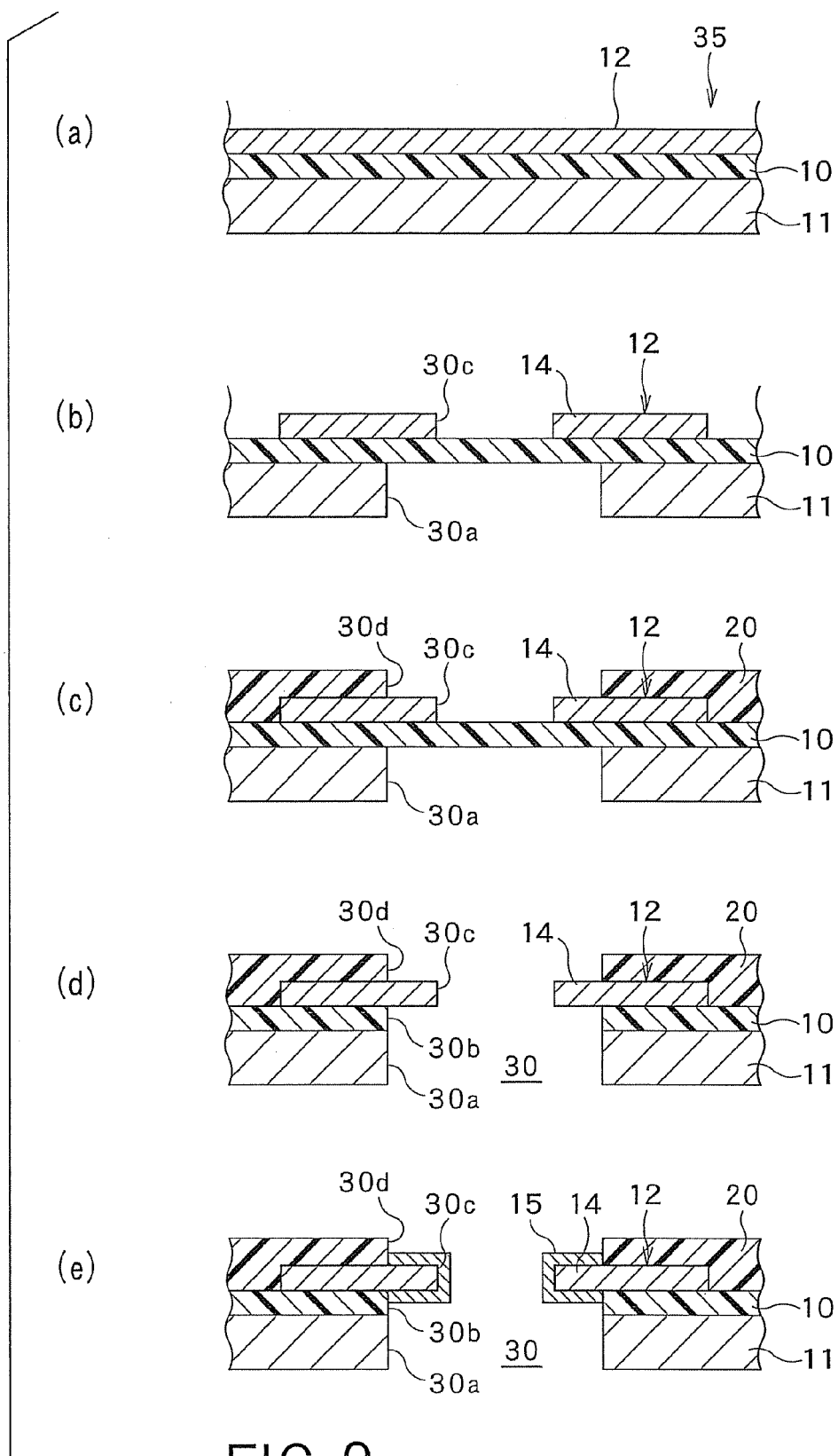
FIGS. 9(*a*) through 9(*e*) are diagrams, respectively provided for illustrating one method for manufacturing the suspension substrate related to the first embodiment of the present invention.

Then, the plurality of wirings 13, alignment section 14 isolated from the wirings 13, and the wiring-layer through hole 30c formed in the alignment section 14 are respectively formed in the wiring layer 12, and the metallic-support-layer through hole 30a is formed to extend through the metallic support layer 11 (see FIG. 9(b)). In this case, a pattern-like resist (not shown) is first formed on the top face of the wiring layer 12 as well as on the bottom face of the metallic support layer 11, by a photo-fabrication method using a dry film. More specifically, each pattern-like resist is provided, such that the plurality of wirings 13, alignment section 14 and wiring-layer through hole 30c can be respectively formed in the wiring layer 12, as well as the metallic-support-layer through hole 30a can be formed in the metallic support layer 11. Subsequently, each part exposed from the resists respectively formed on both of the wiring layer 12 and metallic support layer 11 is etched. For this operation, although not shown in FIG. 9, a metallic-support-layer jig hole constituting each jig hole 25 as shown in FIG. 1 may be formed in the metallic support layer 11. As the method for etching the wiring layer 12 and metallic support layer 11, any suitable method can be employed, without limitation. Preferably, a wet etching method is used. In particular, it is preferred to properly select an etching liquid, depending on the kind of the material used for forming the metallic support layer 11. For instance, in the case of etching the metallic support layer 11 formed of stainless steel, an iron-chloride-based etching liquid, such as an aqueous ferric chloride solution or the like, can be used. After this etching process is ended, the resist is removed.

Thereafter, on the insulating layer 10, the protective layer 20 for covering each wiring 13 of the wiring layer 12 and alignment section 14 is provided, and then the protective-layer through hole 30*d* extending through the protective layer 20 is formed (see FIG. 9(*c*)). In this case, the non-photosensitive polyimide is first coated on the insulating layer 10, by using a die coater. Subsequently, the protective layer 20 is formed by drying up the coated non-photosensitive polyimide. Then, another pattern-like resist (not shown) is formed on the so-formed protective layer 20, in order to form the protective-layer through hole 30*d*. Subsequently, the resultant protective layer 20 is developed and etched, and then the so-etched protective layer 20 is cured or hardened, thereby obtaining the protective layer 20 having a desired shape. In this case, the alignment section 14 of the wiring layer 12 extends to the inward side of the alignment through hole 30. Once this process is ended, the resist is removed.

Thereafter, the insulating-layer through hole 30*b* is formed to extend through the insulating layer 10, and the outer shape of this insulating layer 10 is processed into a desired shape (see FIG. 9(*d*)). In this case, a still another pattern-like resist is first formed on the insulating layer 10, and then each part of the insulating layer 10 exposed from the resist is etched, thereby forming the insulating-layer through hole 30*b* in the insulating layer 10 as well as processing the outer shape of the insulating layer 10. For this operation, although not shown in FIG. 9, an insulating-layer jig hole constituting each jig hole 25 as shown in FIG. 1 may be formed in the insulating layer 10. As the method for etching the insulating layer 10, any suitable method can be employed, without limitation. Preferably, the wet etching method is used. In particular, it is preferred to properly select the etching liquid, depending on the kind of the material used for forming the insulating layer 10. For instance, in the case of etching the insulating layer 10 formed of a polyimide resin, an alkaline etching liquid, such as an organic alkaline etching liquid or the like, can be used. After this etching process is ended, the resist is removed.

Thereafter, the gold plating is provided to the exposed portion of the alignment section 14 of the wiring layer 12 in the alignment through hole 30 (see FIG. 9(*e*)). More specifically, the exposed portion of the alignment section 14 is first washed with an acid, and then a nickel plating and gold plating are provided successively to this portion, by an electrolytic plating method. Thus, the plated layer 15 having the thickness of 0.1 μm to 4.0 μm can be obtained. In this case, the head terminal 5 that will be connected with the slider 52 and the external-equipment connection terminal 6 are also plated in the same manner. As the plating method used in this case, a jig plating method may be employed, in place of the electrolytic plating method. Further, the sort of the metal plating used in this case is not limited to the nickel plating and gold plating. For instance, a silver (Ag) plating and/or copper (Cu) plating may be employed.

Thereafter, the outer shape of the metallic support layer 11 is processed. In this case, a proper pattern-like resist (not shown) is first formed on the bottom face of the metallic support layer 11, by the photo-fabrication method using the dry film. Then, each part of the metallic support layer 11 exposed from the resist is etched with the iron-chloride-based etching liquid, in order to process the outer shape of the metallic support layer 11. Thereafter, the resist is removed.

In this way, the suspension substrate 1 can be obtained.

Now, referring to FIG. 10, one method for manufacturing the suspension related to this embodiment will be described.

First of all, the base plate 42 and load beam 43, as shown in FIGS. 4(*a*), 4(*b*), are respectively prepared, and then the suspension substrate 1 is prepared, in such a manner as described above.

Figure 10:
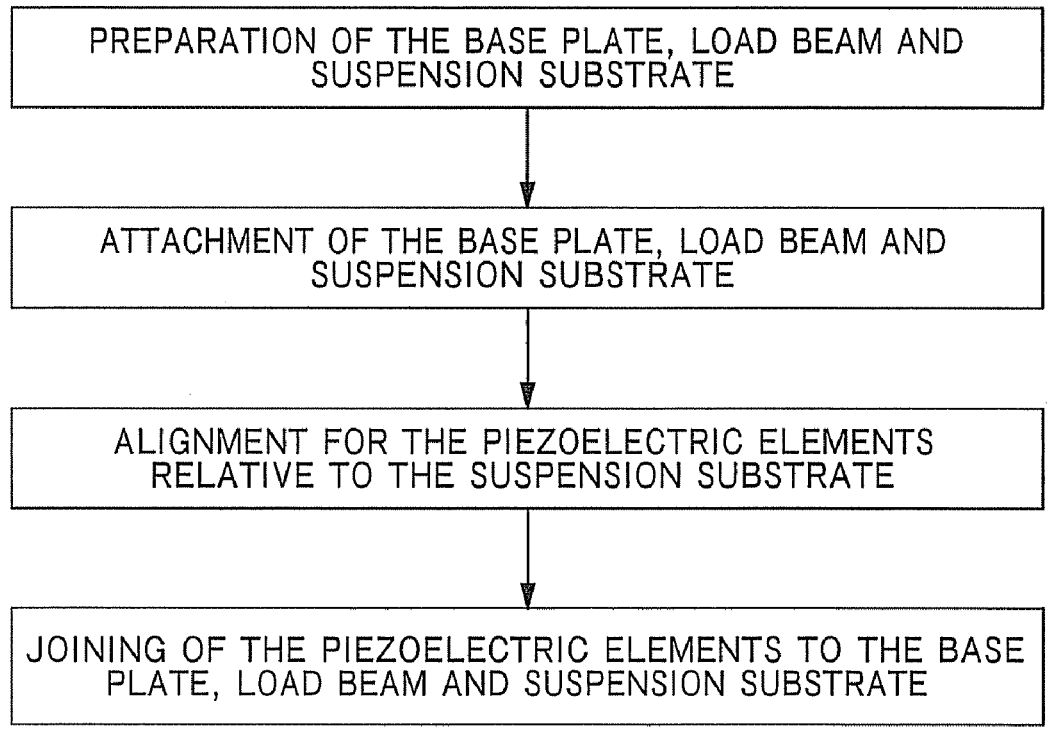
FIG. 10 is a diagram illustrating a flow chart of one method for manufacturing the suspension related to the first embodiment of the present invention.

Thereafter, as shown in FIG. 10, the suspension substrate 1 is attached, by welding, to the base plate 42, via the load beam 43. In this case, the load beam 43 is first fixed in position, by welding, to the base plate 42, and then the suspension substrate 1 is aligned with the load beam 43, by utilizing the jig holes 25 respectively provided to the suspension substrate 1 and the beam jig holes 47 respectively provided to the load beam 43. Thereafter, the suspension substrate 1 is joined and fixed, by welding, to the load beam 43.

Then, each piezoelectric element 44 is aligned with the suspension substrate 1, by using the alignment through hole 30 provided in the suspension substrate 1. In this case, the base plate 42, load beam 43 and suspension substrate 1 are first set in a mounting unit (not shown) for mounting the piezoelectric elements 44, while such members 42, 43 and substrate 1 are fixed in position relative to each other. Subsequently, in this mounting unit, the alignment through hole 30 of the suspension substrate 1 is read by a reading mechanism (not shown), such as a CCD camera or the like, provided for reading the alignment through hole 30. More specifically, since the alignment section 14 of the wiring layer 12 extends to the inward side of the alignment through hole 30, the periphery of the wiring-layer through hole 30*c* constituting the alignment through hole 30 can be read by the CCD camera. Thus, by using the so-read alignment through hole 30, as a reference, each piezoelectric element 44 is positioned relative to the base plate 42 and load beam 43 in the mounting unit. In this way, each piezoelectric element 44 can be aligned, accurately, relative to the suspension substrate 1. In this case, each piezoelectric element 44 is stored in each corresponding recess 42*a* of the base plate 42.

Thereafter, each aligned piezoelectric element 44 is joined to the base plate 42 and load beam 43, by using a proper adhesive, and is connected with the connection structure region of the suspension substrate 1. In this case, each piezoelectric element 44 is joined to the base plate 42 and load beam 43, by using the non-conductive adhesive, and one electrode 44*a* of this piezoelectric element 44 is electrically connected with the base plate 42, via the conductive adhesion section 45 formed of the conductive adhesive. Meanwhile, the other electrode 44*a* of this piezoelectric element 44 is joined and electrically connected relative to the connection structure region 3 of the suspension substrate 1, by using the conductive adhesive.

In this way, the suspension 41 including the piezoelectric elements 44 respectively arranged on both side of the substrate main body region 2 of the suspension substrate 1 can be obtained.

Further, the head suspension 51 as shown in FIG. 7 can be obtained by connecting the slider 52 with the head terminal 5 of the suspension 41. Furthermore, the hard disk drive 61 as shown in FIG. 8 can be obtained by connecting the head suspension 51 with the case 62 of the hard disk drive 61.

Upon writing and reading the data in the hard disk drive 61 shown in FIG. 8, the slider 52 of the head suspension 51 is moved along the disk 63 by the voice coil motor 65, with the desired flying height being kept between the slider 52 and the disk 63 rotated by the spindle motor 64. With this operation, the data is transferred between the slider 52 and the disk 63. During this operation, the electric signal is transmitted through each wiring 13 extending between the head terminal 5 of the suspension substrate 1 and the external equipment connection terminal 6.

Upon moving the slider 52, the voice coil motor 65 serves to roughly control the position of the slider 52, and each piezoelectric element 44 serves to finely control the position of the slider 52. Namely, when the predetermined voltage is applied to each electrode 44a of the piezoelectric elements 44 located on the side of the connection structure regions 3 of the suspension substrate 1, one piezoelectric element 44 will be contracted in the axial direction of the load beam 43, while the other piezoelectric element 44 will be expanded in the same direction. In this case, both of the flexible portion 42b of the base plate 42 and the flexible portion 43b of the load beam 43 are elastically deformed, and thus the slider 52 located on the distal end side of the load beam 43 can be moved in a sway direction (or pivot direction). In this way, the slider 52 can be aligned rapidly and accurately with a desired track of the disk 63.

As stated above, according to this embodiment, the alignment through hole 30 is provided to extend through the metallic support layer 11, insulating layer 10, alignment section 14 of the wiring layer 12, and the protective layer 20, in the substrate main body region 2, such that this alignment through hole 30 can be used for the alignment for the piezoelectric elements 44 when such elements 44 are respectively mounted. Thus, when the suspension 41 is manufactured, the alignment for each piezoelectric element 44 with the suspension substrate 1 can be performed with high accuracy, by using the alignment through hole 30. In particular, in the case in which the pair of piezoelectric elements 44 are arranged to be symmetrical about the central axis (X) of the load beam 43, by enhancing the accuracy of the alignment for each piezoelectric element 44, it is possible to effectively transmit the displacement due to the expansion and contraction of each piezoelectric element 44 to the slider 52, thereby moving the slider 52 more accurately.

Further, according to this embodiment, the alignment section 14 extends to the inward side of the alignment through hole 30, and the diameter of the wiring-layer through hole 30c formed in the wiring layer 12 is smaller than the diameter of the protective-layer through hole 30d formed in the protective layer 20. Thus, upon reading the alignment through hole 30 by using the reading mechanism of the mounting unit for mounting the piezoelectric elements 44, the reference for positioning the piezoelectric elements 44 can be provided, by reading the periphery of the wiring-layer through hole 30c formed in the wiring layer 12. Further, when the alignment through hole 30 is read from the side of the protective layer 20, the periphery of the protective-layer through hole 30d formed in the protective layer 20 is read, in addition to the periphery of the wiring-layer through hole 30c, and then the reference for positioning the piezoelectric elements 44 can be provided, based on the so-read peripheries of the two through holes 30c, 30d. Thus, the accuracy of the alignment for the piezoelectric elements 44 can be further enhanced.

In this embodiment, one example, in which the inspection holes 46a, 46b are respectively provided in the base plate 42 and load beam 43, has been discussed. However, such inspection holes 46a, 46b may not be respectively provided in the base plate 42 and load beam 43. Of course, in this case, the alignment through hole 30 is closed by the base plate 42 and load beam 43. However, because such base plate 42 and load beam 43 are respectively formed of stainless steel that is different from the gold plating provided to the exposed portion of the alignment section 14, the visual confirmation ability relative to the wiring-layer through hole 30c can be enhanced enough. As such, the accuracy of the alignment for the piezoelectric elements 44 can be adequately ensured. Additionally, in this case, the accuracy of the alignment for the piezoelectric elements 44 can be further ensured, by reading the periphery of the protective-layer through hole 30d.

Further, in this embodiment, one example has been described, in which the alignment through hole 30 is located on the central axis (X) of the load beam 43, i.e., on the straight line connecting the two jig holes 25. However, the location of the alignment through hole 30 is not limited to this example. For instance, the alignment through hole 30 may be located in any suitable position of the substrate main body region 2 of the suspension substrate 1. Also in this case, an effect similar to the effect described above can be obtained.

Further, in this embodiment, one example, in which the suspension substrate 1 is manufactured by using the subtractive method, has been described. However, the suspension substrate 1 may be manufactured by using the so-called additive method.

Additionally, in this embodiment, one example, in which the pair of piezoelectric elements 44 are respectively joined to the base plate 42 and load beam 43, has been discussed. However, the pair of piezoelectric elements 44 may be respectively joined only to the base plate 42 in any suitable positions thereof, or otherwise may be joined only to the load beam 43. Further, a slider holding plate (not shown) for holding the slider 52 may be provided at the distal end of the load beam 43, such that the pair of piezoelectric elements 44 can be joined to a region between the load beam 43 and the slider holding plate.

Second Embodiment

Now, referring to FIG. 11, the suspension substrate, suspension, head suspension and hard disk drive, respectively related to the second embodiment of the present invention, and one method for manufacturing the suspension of this embodiment will be described.

Figure 11:
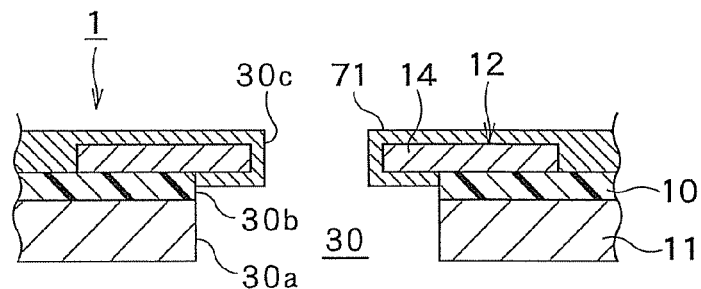
FIG. 11 is a cross section showing the alignment through hole provided in the suspension substrate related to a second embodiment of the present invention.

A key point of this second embodiment shown in FIG. 11 is that the alignment section of the wiring layer is not covered with the protective layer, and is thus exposed to the outside. Except for this key point, the other construction of the second embodiment is substantially the same as the first embodiment shown in FIGS. 1 through 10. It is noted that like parts in the first embodiment shown in FIGS. 1 through 10 are respectively designated by like reference numerals in FIG. 11, and further explanation on such parts will be omitted below.

As shown in FIG. 11, the alignment section 14 of the wiring layer 12 in the substrate main body region 2 is not covered with the protective layer 20 as shown in FIG. 2, and is thus exposed to the outside. Further, the alignment through hole 30 shown in FIG. 11 is composed of the metallic-support-layer through hole 30a formed in the metallic support layer 11, the insulating-layer through hole 30b formed in the insulating layer 10, and the wiring-layer through hole 30c formed in the wiring layer 12. Further, a plated layer 71 is provided to the exposed portion of the alignment section 14, by providing the nickel plating and gold plating, successively, to this exposed portion. As such, unwanted corrosion of the exposed portion of the alignment section 14 of the wiring layer 12 can be well prevented. It is noted that the plated layer 71 can be formed in the same manner as in the case of forming the plated layer 15 described in the first embodiment (see FIG. 2).

Namely, in this embodiment, the alignment through hole 30 is provided to extend through the metallic support layer 11, insulating layer 10 and alignment section 14 of the wiring layer 12, in the substrate main body region 2, such that this alignment through hole 30 can be used for the alignment for the piezoelectric elements 44 when such elements 44 are respectively mounted. With this configuration, each piezoelectric element 44 can be aligned accurately relative to the suspension substrate 1 by using the alignment through hole 30, when the suspension 41 is manufactured. In particular, in the case in which the pair of piezoelectric elements 44 are arranged to be symmetrical about the central axis (X) of the load beam 43, by enhancing the accuracy of the alignment for each piezoelectric element 44, it is possible to effectively transmit the displacement due to the expansion and contraction of each piezoelectric element 44 to the slider 52, thereby moving the slider 52, more accurately.

Further, according to this embodiment, the alignment section 14 of the wiring layer 12 extends to the inward side of the alignment through hole 30, and the diameter of the wiring-layer through hole 30c formed in the wiring layer 12 is smaller than the diameter of the insulating-layer through hole 30b formed in the insulating layer 10 as well as smaller than the diameter of the metallic-support-layer through hole 30a formed in the metallic support layer 11. Thus, upon reading the alignment through hole 30 by using the reading mechanism of the mounting unit for mounting the piezoelectric elements 44, the reference for positioning the piezoelectric elements 44 can be provided, by reading the periphery of the wiring-layer through hole 30c formed in the wiring layer 12.

Further, in this embodiment, even in the case in which the inspection holes 46a, 46b are not respectively provided in the base plate 42 and load beam 43, the visual confirmation ability relative to the wiring-layer through hole 30c can be well ensured, because such base plate 42 and load beam 43 are respectively formed of stainless steel that is different from the material (gold) used for the plating provided to the alignment section 14. Therefore, the accuracy of the alignment for the piezoelectric elements 44 can be enhanced, by utilizing such ensured visual confirmation ability.

Third Embodiment

Now, referring to FIG. 12, the suspension substrate, suspension, head suspension and hard disk drive, respectively related to the third embodiment of the present invention, and one method for manufacturing the suspension of this embodiment will be described.

Figure 12:
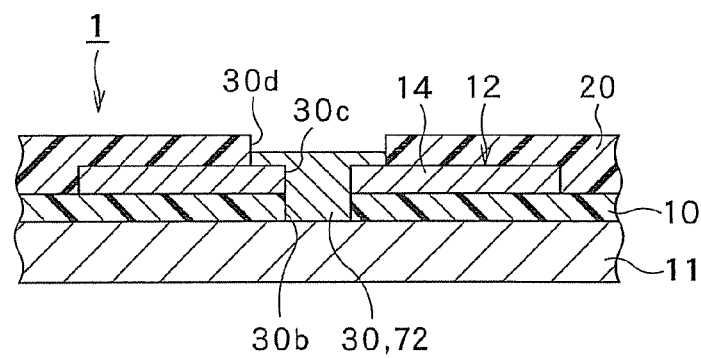
FIG. 12 is a cross section showing the alignment through hole provided in the suspension substrate related to a third embodiment of the present invention.

A key point of the third embodiment shown in FIG. 12 is that the nickel plating is provided to the alignment through hole. Except for this key point, the other construction of this third second embodiment is substantially the same as the first embodiment shown in FIGS. 1 through 10. It is noted that like parts in the first embodiment shown in FIGS. 1 through 10 are respectively designated by like reference numerals in FIG. 11, and further explanation on such parts will be omitted below.

As shown in FIG. 12, the alignment through hole 30 is provided to extend through the insulating layer 10, alignment section 14 of the wiring layer 14, and protecting layer 20, in the substrate main body region 2, such that this alignment through hole 30 can be used upon performing the alignment for the piezoelectric elements 44 when such elements 44 are respectively mounted. Namely, this alignment through hole 30 is composed of the insulating-layer through hole 30b formed in the insulating layer 10, the wiring-layer through hole 30c formed in the alignment section 14 of the wiring layer 12, and the protective-layer through hole 30d formed in the protective layer 20. Further, in this embodiment, the diameter of the protective-layer through hole 30d is larger than the diameter of the insulating-layer through hole 30b as well as larger than the diameter of the wiring-layer through hole 30c.

In this case, the nickel plating is provided to the alignment through hole 30, in order to provide a via 72 formed of nickel. This via 72 extends from the insulating-layer through hole 30b to the protective-layer through hole 30d.

In the case in which the suspension substrate 1 shown in FIG. 12 is manufactured, the nickel plating is provided to the alignment through hole 30, after the insulating-layer through hole 30b is formed in the insulating layer 10 and the outer shape of this insulating layer 10 is processed. In this case, a suitable pattern-like resist (not shown) is first formed on the protective layer 20, by using the dry film, such that the alignment through hole 30 can be exposed. Subsequently, the nickel plating is provided to the alignment through hole 30, by the electrolytic plating method. Upon this electrolytic plating, a nickel sulfamate plating bath (or liquid) is used, as a plating bath (or liquid), in an electrolytic dip plating method (0.2 A, 14 minutes). In this way, the via 72 formed of nickel can be provided to the alignment through hole 30. Thereafter, the resist is removed. In this case, the via 72 may be formed, after the nickel plating and gold plating are respectively provided to the exposed portion of the alignment section 14 of the wiring layer 12 in the alignment through hole 30.

As described above, according to this embodiment, the alignment through hole 30 is provided to extend through the insulating layer 10, alignment section 14 of the wiring layer 12, and protective layer 20, in the substrate main body region 2, such that this alignment through hole 30 can be used upon performing the alignment for the piezoelectric elements 44 when such elements 44 are respectively mounted. With the provision of this alignment through hole 30, the piezoelectric elements 44 can be accurately aligned relative to the suspension substrate 1, by using the alignment through hole 30, upon the manufacture of the suspension 41. In particular, in the case in which the pair of piezoelectric elements 44 are arranged to be symmetrical about the central axis (X) of the load beam 43, by enhancing the accuracy of the alignment for each piezoelectric element 44, it is possible to effectively transmit the displacement due to the expansion and contraction of each piezoelectric element 44 to the slider 52, thereby moving the slider 52 with significantly high accuracy.

Further, according to this embodiment, the periphery of the protective-layer through hole 30d constituting the alignment through hole 30 can be read, upon reading the alignment through hole 30 by using the reading mechanism of the mounting unit for mounting the piezoelectric elements 44. In this case, since the nickel plating is provided to the alignment through hole 30, the visual confirmation ability relative to the protective-layer through hole 30d can be ensured, thereby significantly enhancing the accuracy of the alignment for the piezoelectric elements 44.

Fourth Embodiment

Next, referring to FIG. 13, the suspension substrate, suspension, head suspension and hard disk drive, respectively related to the fourth embodiment of the present invention, and one method for manufacturing the suspension of this embodiment will be described.

Figure 13:
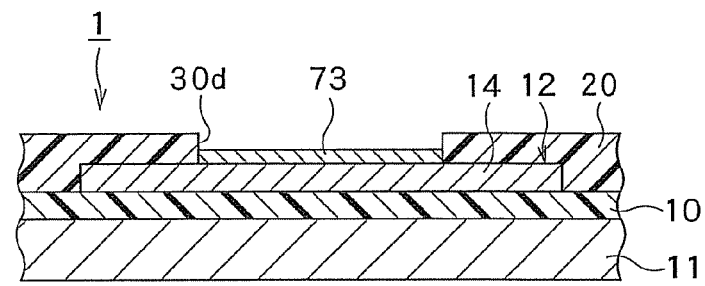
FIG. 13 is a cross section showing the alignment through hole provided in the suspension substrate related to a fourth embodiment of the present invention.

A key point of this embodiment as shown in FIG. 13 is that the alignment through hole is composed of only the protective-layer through hole formed in the protective layer, wherein the gold plating is provided to the exposed portion of the alignment section of the wiring layer in the alignment through hole. Except for this key point, the other construction of this fourth embodiment is substantially the same as the first embodiment shown in FIGS. 1 through 10. It is noted that like parts in the first embodiment shown in FIGS. 1 through 10 are respectively designated by like reference numerals in FIG. 13, and further explanation on such parts will be omitted below.

In this embodiment, as shown in FIG. 13, the alignment through hole 30 is composed of only the protective-layer through hole 30d formed in the protective layer 20 in the substrate main body region 2, wherein a plated layer 73 is formed on the exposed portion of the alignment section 14 of the wiring layer 12 in the alignment through hole 30, by providing the nickel plating and gold plating, successively, to this exposed portion. The provision of this plated layer 73 can effectively prevent the exposed portion of the alignment section 14 of the wiring layer 12 from being corroded. It is noted that the plated layer 73 can be formed in the same manner as in the case of forming the plated layer 15 described in the first embodiment (see FIG. 2).

According to this embodiment, the alignment through hole 30 is provided to extend through the protective layer 20 in the substrate main body region 2, such that this alignment through hole 30 can be used upon performing the alignment for the piezoelectric elements 44 when such elements 44 are respectively mounted. With the provision of this alignment through hole 30, the piezoelectric elements 44 can be accurately aligned relative to the suspension substrate 1, by using the alignment through hole 30, upon the manufacture of the suspension 41. In particular, in the case in which the pair of piezoelectric elements 44 are arranged to be symmetrical about the central axis (X) of the load beam 43, by enhancing the accuracy of the alignment for each piezoelectric element 44, it is possible to effectively transmit the displacement due to the expansion and contraction of each piezoelectric element 44 to the slider 52, thereby moving the slider 52 more accurately.

Further, according to this embodiment, the periphery of the protective-layer through hole 30d constituting the alignment through hole 30 can be read, upon reading the alignment through hole 30 by using the reading mechanism of the mounting unit for mounting the piezoelectric elements 44. In this case, since the gold plating is provided to the exposed portion of the alignment section 14 of the wiring layer 12 in the alignment through hole 30, the visual confirmation ability relative to the protective-layer through hole 30d can be well ensured, thereby significantly enhancing the accuracy of the alignment for the piezoelectric elements 44.

Fifth Embodiment

Next, referring to FIG. 14, the suspension substrate, suspension, head suspension and hard disk drive, respectively related to the fifth embodiment of the present invention, and one method for manufacturing the suspension of this embodiment will be described.

Figure 14:
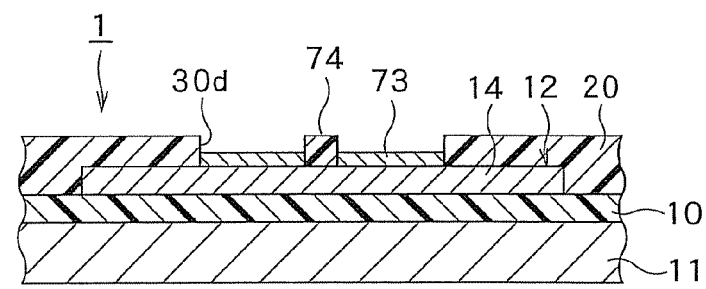
FIG. 14 is a cross section showing the alignment through hole provided in the suspension substrate related to a fifth embodiment of the present invention.

A key point of the fifth embodiment as shown in FIG. 14 is that the alignment through hole is composed of only the protective-layer through hole formed in the protective layer, wherein the gold plating is provided to the exposed portion of the alignment section of the wiring layer in the alignment through hole, and a protective-layer separation section is provided to a central portion of the alignment through hole. Except for this key point, the other construction of the fifth embodiment is substantially the same as the first embodiment shown in FIGS. 1 through 10. It is noted that like parts in the first embodiment shown in FIGS. 1 through 10 are respectively designated by like reference numerals in FIG. 14, and further explanation on such parts will be omitted below.

Namely, in the fifth embodiment as shown in FIG. 14, the alignment through hole 30 is composed of only the protective-layer through hole 30d formed in the protective layer 20 in the substrate main body region 2, wherein the plated layer 73 is formed on the exposed portion of the alignment section 14 of the wiring layer 12 in the alignment through hole 30, by providing the nickel plating and gold plating, successively, to this exposed portion. This plated layer 73 can effectively prevent the exposed portion of the alignment section 14 of the wiring layer 12 from being corroded. It is noted that this plated layer 73 can be formed in the same manner as in the case of forming the plated layer 15 described in the first embodiment (see FIG. 2).

Further, in this embodiment, the protective layer 20 includes the protective-layer separation portion 74 provided to the central portion of the alignment through hole 30 and having a columnar shape. In this way, the alignment through hole 30 is formed into a doughnut-like shape.

According to this embodiment, the alignment through hole 30 is provided to extend through the protective layer 20 in the substrate main body region 2, such that this alignment through hole 30 can be used for the alignment for the piezoelectric elements 44 when such elements 44 are respectively mounted. Thus, the piezoelectric elements 44 can be accurately aligned relative to the suspension substrate 1, by using the alignment through hole 30, upon the manufacture of the suspension 41. In particular, in the case in which the pair of piezoelectric elements 44 are arranged to be symmetrical about the central axis (X) of the load beam 43, by enhancing the accuracy of the alignment for each piezoelectric element 44, it is possible to effectively transmit the displacement due to the expansion and contraction of each piezoelectric element 44 to the slider 52, thereby moving the slider 52 more accurately.

Further, according to this embodiment, the periphery of the protective-layer through hole 30d constituting the alignment through hole 30 can be read, upon reading the alignment through hole 30 by using the reading mechanism of the mounting unit for mounting the piezoelectric elements 44. In this case, since the gold plating is provided to the exposed portion of the alignment section 14 of the wiring layer 12 in the alignment through hole 30, the visual confirmation ability for the protective-layer through hole 30d can be well ensured, thereby significantly enhancing the accuracy of the alignment for the piezoelectric elements 44.

Furthermore, according to this embodiment, the protective-layer separation portion 74 is provided to the central portion of the alignment through hole 30. With this configuration, the periphery of the protective-layer separation portion 74 can be read, together with the periphery of the protective-layer through hole 30d, upon reading the alignment through hole 30 by using the reading mechanism of the mounting unit. Thus, the reference for positioning the piezoelectric elements 44 can be provided, more adequately, based on the peripheries of such the alignment through hole 30 and the protective-layer separation portion 74. Therefore, the accuracy of the alignment for the piezoelectric elements 44 can be further enhanced.

While several preferred embodiments of the present invention have been described and shown in detail, each of the suspension substrate, suspension, head suspension and hard disk drive, as well as the method for manufacturing the suspension, respectively related to this invention, is not limited, in any way, to such embodiments. Namely, various modifications and variations can be made to such embodiments, without departing from the scope and gist of this invention.

The invention claimed is:

1. A suspension substrate including a substrate main body region and a pair of connection structure regions, respectively connectable with actuator elements that are respectively arranged on both sides of the substrate main body region, the suspension substrate comprising:
an insulating layer;
a metallic support layer provided on one face of the insulating layer;
a wiring layer provided on the other face of the insulating layer, the wiring layer including a plurality of wirings and an alignment section located in the substrate main body region and isolated from each wiring; and
an alignment through hole provided to extend through the metallic support layer, insulating layer and alignment section of the wiring layer, in the substrate main body region, the alignment through hole being used for alignment for the actuator elements.

2. The suspension substrate according to claim 1, wherein the alignment through hole is located on a central axis of a load beam for holding the metallic support layer.

3. The suspension substrate according to claim 1, further comprising two jig holes, respectively provided to extend through the metallic support layer and insulating layer, the jig holes being used for the alignment when a load beam for holding the metallic support layer is mounted,
wherein the alignment through hole is located on a straight line connecting the two jig holes.

4. The suspension substrate according to claim 1,
wherein the alignment section of the wiring layer extends to the inward side of the alignment through hole, and
wherein a gold plating is provided to an exposed portion of the alignment section of the wiring layer in the alignment through hole.

5. The suspension substrate according to claim 1, further comprising a protective layer for covering each wiring and the alignment section of the wiring layer,
wherein the alignment through hole extends through the protective layer.

6. A suspension substrate including a substrate main body region and a pair of connection structure regions, respectively connectable with actuator elements that are respectively arranged on both sides of the substrate main body region, the suspension substrate comprising:
an insulating layer;
a metallic support layer provided on one face of the insulating layer;
a wiring layer provided on the other face of the insulating layer, the wiring layer including a plurality of wirings and an alignment section located in the substrate main body region and isolated from each wiring;
a protective layer for covering each wiring and the alignment section of the wiring layer; and
an alignment through hole provided in a position corresponding to the alignment section of the wiring layer, the alignment through hole extending through the protective layer and being used for alignment for the actuator elements.

7. The suspension substrate according to claim 6, wherein the alignment through hole is located on a central axis of a load beam for holding the metallic support layer.

8. The suspension substrate according to claim 6, further comprising two jig holes, respectively provided to extend through the metallic support layer and insulating layer, the jig holes being used for the alignment when the load beam for holding the metallic support layer is mounted,
wherein the alignment through hole is located on a straight line connecting the two jig holes.

9. The suspension substrate according to claim 6,
wherein the alignment through hole extends through the alignment section of the wiring layer and the insulating layer, and
wherein a nickel plating is provided to the alignment through hole.

10. The suspension substrate according to claim 6, wherein a gold plating is provided to an exposed portion of the alignment section of the wiring layer in the alignment through hole.

11. The suspension substrate according to claim 10, wherein the protective layer includes a protective layer separation portion formed at a central portion of the alignment through hole.

12. A suspension, comprising:
a base plate;
the suspension substrate according to claim 1 and attached to the base plate via a load beam; and
a pair of actuator elements respectively joined to at least one of the base plate and load beam and connected with the connection structure regions of the suspension substrate.

13. The suspension according to claim 12, wherein an inspection hole for allowing at least a part of the periphery of the alignment through hole to be exposed is formed in the base plate and load beam.

14. The suspension according to claim 13, wherein the inspection hole has a shape different from the alignment through hole.

15. The suspension according to claim 13, wherein the periphery of the alignment through hole is all exposed in the inspection hole.

16. A suspension, comprising:
a base plate;
the suspension substrate according to claim 6 and attached to the base plate via a load beam; and
a pair of actuator elements respectively joined to at least one of the base plate and load beam and connected with the connection structure regions of the suspension substrate.

17. A head suspension, comprising:
the suspension according to claim 12; and
a slider mounted on the suspension.

18. A head suspension, comprising:
the suspension according to claim 16; and
a slider mounted on the suspension.

19. A hard disk drive comprising the head suspension according to claim 17.

20. A hard disk drive comprising the head suspension according to claim 18.

21. A method for manufacturing a suspension including a substrate main body region and a pair of connection structure regions, respectively connectable with actuator elements that are respectively arranged on both sides of the substrate main body region, the method comprising:
preparing a suspension substrate including an insulating layer, a metallic support layer provided on one face of the insulating layer, a wiring layer provided on the other face of the insulating layer, the wiring layer including a plurality of wirings and an alignment section located in the substrate main body region and isolated from each wiring, and an alignment through hole provided to extend through the metallic support layer, insulating layer and alignment section of the wiring layer, in the substrate main body region, the alignment through hole being used for alignment for the actuator elements;

attaching the suspension substrate to a base plate via a load beam;

aligning the actuator elements with the suspension substrate, by using the alignment through hole of the suspension substrate; and joining the aligned actuator elements to at least one of the base plate and load beam by using an adhesive, as well as connecting the actuator elements with the connection structure regions of the suspension substrate.

* * * * *